United States Patent
Tan et al.

(10) Patent No.: US 9,535,531 B2
(45) Date of Patent: Jan. 3, 2017

(54) ACTIVE MATRIX ORGANIC LIGHT EMITTING DIODE PIXEL UNIT CIRCUIT, DISPLAY PANEL AND ELECTRONIC PRODUCT

(71) Applicants: BOE TECHNOLOGY GROUP CO., LTD., Beijing (CN); CHENGDU BOE OPTOELECTRONICS TECHNOLOGY CO., LTD., Sichuan (CN)

(72) Inventors: Wen Tan, Beijing (CN); Xiaojing Qi, Beijing (CN); Quanguo Zhou, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 169 days.

(21) Appl. No.: 14/234,937

(22) PCT Filed: Sep. 24, 2013

(86) PCT No.: PCT/CN2013/084055
§ 371 (c)(1),
(2) Date: Jan. 24, 2014

(87) PCT Pub. No.: WO2014/205931
PCT Pub. Date: Dec. 31, 2014

(65) Prior Publication Data
US 2015/0301674 A1  Oct. 22, 2015

(30) Foreign Application Priority Data

Jun. 26, 2013 (CN) .......................... 2013 1 0260936

(51) Int. Cl.
*G06F 3/041* (2006.01)
*G09G 3/32* (2016.01)
(Continued)

(52) U.S. Cl.
CPC ............. *G06F 3/0416* (2013.01); *G06F 3/042* (2013.01); *G06F 3/0412* (2013.01);
(Continued)

(58) Field of Classification Search
CPC ...... G06F 3/0416; G06F 3/042; G06F 3/0412; G09G 3/3258; G09G 2300/043; G09G 2300/0861; G09G 3/3233; G09G 2320/045; G09G 2310/0291; G09G 2300/0809; G09G 2320/0626; H01L 27/3248; H01L 27/3265; H01L 27/3276; H01L 27/323; H01L 27/3262
(Continued)

(56) References Cited

U.S. PATENT DOCUMENTS

2005/0093791 A1  5/2005  Lo
2006/0164344 A1  7/2006  Fish
(Continued)

FOREIGN PATENT DOCUMENTS

CN      1669067 A      9/2005
CN      101576676 A    11/2009
(Continued)

OTHER PUBLICATIONS

Fourth Office Action regarding Chinese application No. 201310260936.3, dated Sep. 30, 2015. Translation provided by Dragon Intellectual Property Law Firm.
(Continued)

*Primary Examiner* — Stephen Sherman
(74) *Attorney, Agent, or Firm* — Harness, Dickey & Pierce, P.L.C.

(57) ABSTRACT

The present invention provides an Active Matrix Organic Light Emitting Diode (AMOLED) pixel unit circuit, a display panel and an electronic product for integrating a touch screen circuit into the AMOLED pixel unit circuit and producing an AMOLED display panel having the functionality of a touch screen. The AMOLED pixel unit circuit comprises a driving module, configured to amplify a sensing signal generated by a touch sensing module, output the sensing signal through a sensing signal output module, and drive a light emitting module; the light emitting control module, configured to control the light emitting module to emit light; a threshold compensation module, configured to compensate a threshold voltage of the driving module; the touch sensing module, configured to generate the sensing signal and output the sensing signal to the driving module; and the sensing signal output module, configured to output the sensing signal amplified by the driving module.

14 Claims, 5 Drawing Sheets

(51) Int. Cl.
*H01L 27/32* (2006.01)
*G06F 3/042* (2006.01)

(52) U.S. Cl.
CPC ......... *G09G 3/3258* (2013.01); *H01L 27/323* (2013.01); *H01L 27/3248* (2013.01); *H01L 27/3262* (2013.01); *H01L 27/3265* (2013.01); *H01L 27/3276* (2013.01); *G09G 3/3233* (2013.01); *G09G 2300/043* (2013.01); *G09G 2300/0809* (2013.01); *G09G 2300/0861* (2013.01); *G09G 2310/0262* (2013.01); *G09G 2310/0291* (2013.01); *G09G 2320/045* (2013.01); *G09G 2320/0626* (2013.01); *G09G 2360/148* (2013.01)

(58) Field of Classification Search
USPC ......... 345/173–178; 178/18.01–18.09, 18.11
See application file for complete search history.

(56) References Cited

U.S. PATENT DOCUMENTS

| | | | |
|---|---|---|---|
| 2006/0214893 A1 | 9/2006 | Tseng et al. | |
| 2006/0267508 A1* | 11/2006 | Sun | G09G 3/3233 315/169.3 |
| 2009/0153438 A1 | 6/2009 | Miller et al. | |
| 2009/0225011 A1 | 9/2009 | Choi | |
| 2009/0231308 A1* | 9/2009 | Numao | G09G 3/3233 345/204 |
| 2010/0012823 A1* | 1/2010 | Ahn | G06F 3/042 250/214 R |
| 2010/0039406 A1 | 2/2010 | Lee et al. | |
| 2010/0097350 A1* | 4/2010 | Choi | G06F 3/042 345/175 |
| 2010/0097354 A1* | 4/2010 | Ahn | G06F 3/042 345/175 |
| 2010/0144391 A1 | 6/2010 | Chang et al. | |
| 2010/0220069 A1 | 9/2010 | Choi et al. | |
| 2011/0001711 A1* | 1/2011 | Choi | G06F 3/0412 345/173 |
| 2011/0115764 A1 | 5/2011 | Chung | |
| 2012/0038585 A1 | 2/2012 | Kim | |
| 2012/0044176 A1 | 2/2012 | Nakamura et al. | |
| 2012/0061556 A1* | 3/2012 | Chan | G09G 3/3233 250/214 R |
| 2012/0154319 A1 | 6/2012 | Konicek | |
| 2013/0063407 A1 | 3/2013 | Usukura et al. | |
| 2013/0088165 A1 | 4/2013 | Wang et al. | |
| 2013/0106828 A1 | 5/2013 | Kim | |
| 2013/0127787 A1 | 5/2013 | Kim et al. | |
| 2013/0146881 A1 | 6/2013 | Yamazaki et al. | |
| 2014/0055326 A1* | 2/2014 | Lai | G09G 3/3233 345/77 |
| 2014/0118231 A1 | 5/2014 | Yang et al. | |
| 2014/0168127 A1 | 6/2014 | Yang | |

FOREIGN PATENT DOCUMENTS

| | | |
|---|---|---|
| CN | 101587256 A | 11/2009 |
| CN | 101587400 A | 11/2009 |
| CN | 101630481 A | 1/2010 |
| CN | 101726890 A | 6/2010 |
| CN | 101943974 A | 1/2011 |
| CN | 101944323 A | 1/2011 |
| CN | 102117596 A | 7/2011 |
| CN | 102402931 A | 4/2012 |
| CN | 102903333 A | 1/2013 |
| CN | 103135846 A | 6/2013 |
| CN | 103295525 A | 9/2013 |
| CN | 103325343 A | 9/2013 |
| CN | 103354078 A | 10/2013 |
| CN | 103354079 A | 10/2013 |
| CN | 103354080 A | 10/2013 |
| CN | 203242305 U | 10/2013 |
| CN | 203300191 U | 11/2013 |
| CN | 203300192 U | 11/2013 |
| CN | 203300193 U | 11/2013 |
| CN | 203300194 U | 11/2013 |
| JP | 2010085526 A | 4/2010 |
| KR | 20070115261 A | 12/2007 |
| KR | 20090009387 A | 1/2009 |

OTHER PUBLICATIONS

Written Opinion of the International Searching Authority for international application No. PCT/CN2013/084055.
International Search Report and Written Opinion dated Sep. 24, 2013 regarding PCT/CN2013/084055.
Chinese Office Action dated Feb. 28, 2015 regarding Chinese Application no. 201310260936.3 Translation provided by Dragon Intellectual Property Law Firm.
Chinese Office Action dated Dec. 3, 2014 regarding Application No. 201310260936.3, filed Jun. 26, 2013. Translation provided by Dragon Intellectual Property Law Firm.
First Chinese Office Action regarding Application No. 2013102600458 dated Nov. 24, 2014. Translation provided by Dragon Intellectual Property Law Firm.
Written Opinion of the International Searching Authority regarding International Application No. PCT/CN2013/084057.
First Chinese Office Action regarding Application No. 2013102597065 dated Nov. 15, 2014. Translation provided by Dragon Intellectual Property Law Firm.
Written Opinion of the International Searching Authority for International Application No. PCT/CN2013/084919.
First Chinese Office Action regarding Application No. 2013102716882 dated Nov. 3, 2014. Translation provided by Dragon Intellectual Property Law Firm.
Written Opinion of the International Searching Authority regarding International Application No. PCT/CN2013-089701.

* cited by examiner

ACTIVE MATRIX ORGANIC LIGHT EMITTING DIODE PIXEL UNIT CIRCUIT, DISPLAY PANEL AND ELECTRONIC PRODUCT

CROSS-REFERENCE TO RELATED APPLICATIONS

This application is a U. S. National Stage of International No. PCT/CN2013/084055, filed on Sep. 24, 2013. This application claims the benefit of Chinese Patent Application No. 201310260936.3, filed on Jun. 26, 2013. The disclosures of the above applications are incorporated herein by reference.

TECHNICAL FIELD

The present invention relates to the field of display, in particular to an active matrix organic light emitting diode pixel unit circuit, a display panel and an electronic product.

BACKGROUND

The technology of Touch Screen Panel (TSP) in Cell is to manufacture a TSP sensor and a driving circuit thereof on an array substrate using an array process. The TSP sensor is integrated with a liquid crystal cell of a Liquid Crystal Display (LCD) panel so that the product is light and thin and has versatile functionalities. Therefore, the reliability of the TSP is effectively improved.

FIG. 1 (a) and FIG. 1 (b) shows a basic light sensitive TSP in Cell circuit in prior art. As shown in FIG. 1(a), the sensor senses light using a photodiode D1 and generates electric leakage to detect a touch signal. As shown in FIG. 1(b), the sensor senses light using a sensitive capacitor C2 and detects the touch signal by the coupling of the sensitive capacitor and the change of the capacitor. Thin-Film Transistor (TFT) T1 functions as an amplifying transistor to amplify the voltage change across D1 after detecting the touch signal, increase the capability to driving the output of the TSP in Cell circuit, so that an external readout circuit for TSP may correctly read out the detection result.

Compared with a traditional liquid crystal panel, an Active Matrix Organic Light Emitting Diode (AMOLED) has characteristics of rapider response, higher contrast ratio, and wider angle of view or the like. Pixels of AMOLED are driven to emit light and display by a related driving circuit on the array substrate. FIG. 2 is a diagram showing an embodiment of the AMOLED pixel unit circuit.

If the TSP in cell circuit shown in FIG. 1 (a) or FIG. 1 (b) is simply integrated into the AMOLED pixel unit circuit as shown in FIG. 2, except for the existing five TFTs and two capacitors, three TFTs and one capacitor is required to be added, and except for the existing three control signals and two power sources, three control signals are required to be added to the control signal lines. However, the pixels of the AMOLED do not have enough space for the addition of these TFTs and signal lines. Therefore, in the prior art, the TSP in Cell circuit cannot be integrated into the AMOLED pixel unit circuit.

SUMMARY

An embodiment of present invention provides an Active Matrix Organic Light Emitting Diode (AMOLED) pixel unit circuit, a display panel and an electronic product, for integrating a touch screen circuit into the AMOLED pixel unit circuit, manufacturing an AMOLED display panel having the functionality of a touch screen, and producing an electronic product having the display panel.

An embodiment of present invention provides an active matrix organic light emitting diode pixel unit circuit, comprising: a light emitting module, a driving module, a threshold compensation module, a light emitting control module, a touch sensing module and a sensing signal outputting module, wherein the driving module is configured to amplify a sensing signal generated by the touch sensing module, output the sensing signal through the sensing signal outputting module, and drive the light emitting module;

the light emitting control module is configured to control the light emitting module to emit light;

the threshold compensation module is configured to compensate a threshold voltage of the driving module;

the touch sensing module is configured to generate the sensing signal and output the sensing signal to the driving module; and the sensing signal outputting module is configured to output the sensing signal amplified by the driving module.

An embodiment of present invention provides a display panel, comprising the AMOLED pixel unit circuit.

An embodiment of present invention provides an electronic product having the display panel.

According to above technical solution, a few circuit components are added into the AMOLED pixel unit circuit according to an embodiment of the present invention, and the TSP in Cell circuit is integrated into the AMOLED pixel unit circuit using common data lines, circuit components and control signals and so on.

DETAILED DESCRIPTION OF THE PREFERRED EMBODIMENTS

An embodiment of the present invention provides an Active Matrix Organic Light Emitting Diode (AMOLED) pixel unit circuit, a display panel and an electronic product for integrating the touch screen circuit into the AMOLED pixel unit circuit, manufacturing an AMOLED display panel having the functionality of a touch screen function, and producing an electronic product having the display panel.

Figure 1A:
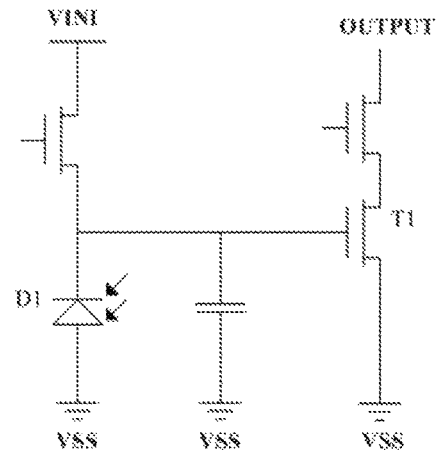
FIG. 1 (a) and FIG. 1 (b) are schematic diagrams showing touch screen circuits in the prior art.
Figure 1B:
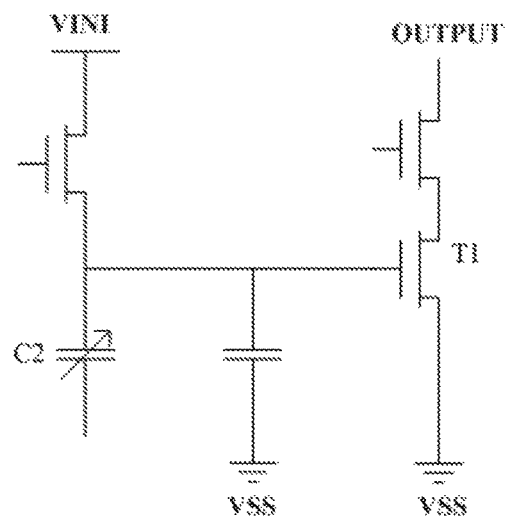
Figure 2:
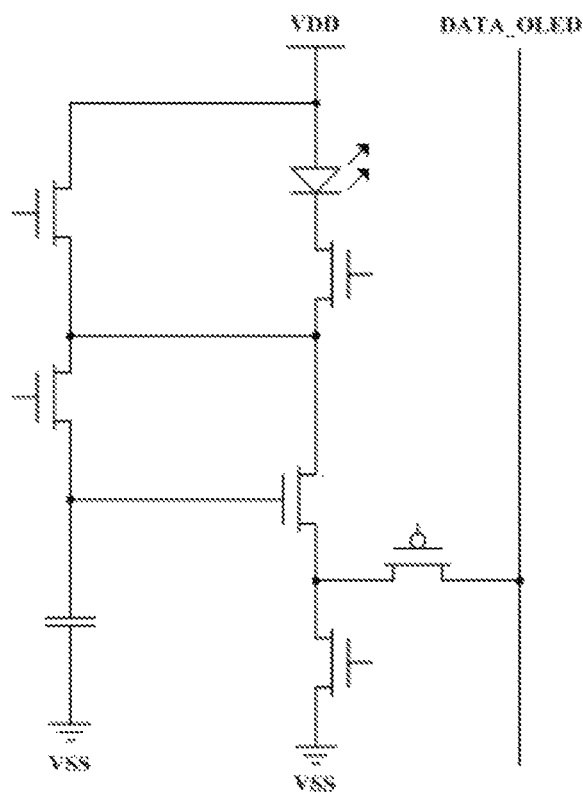
FIG. 2 is a schematic diagram showing an AMOLED pixel unit circuit in the prior art.
Figure 3:
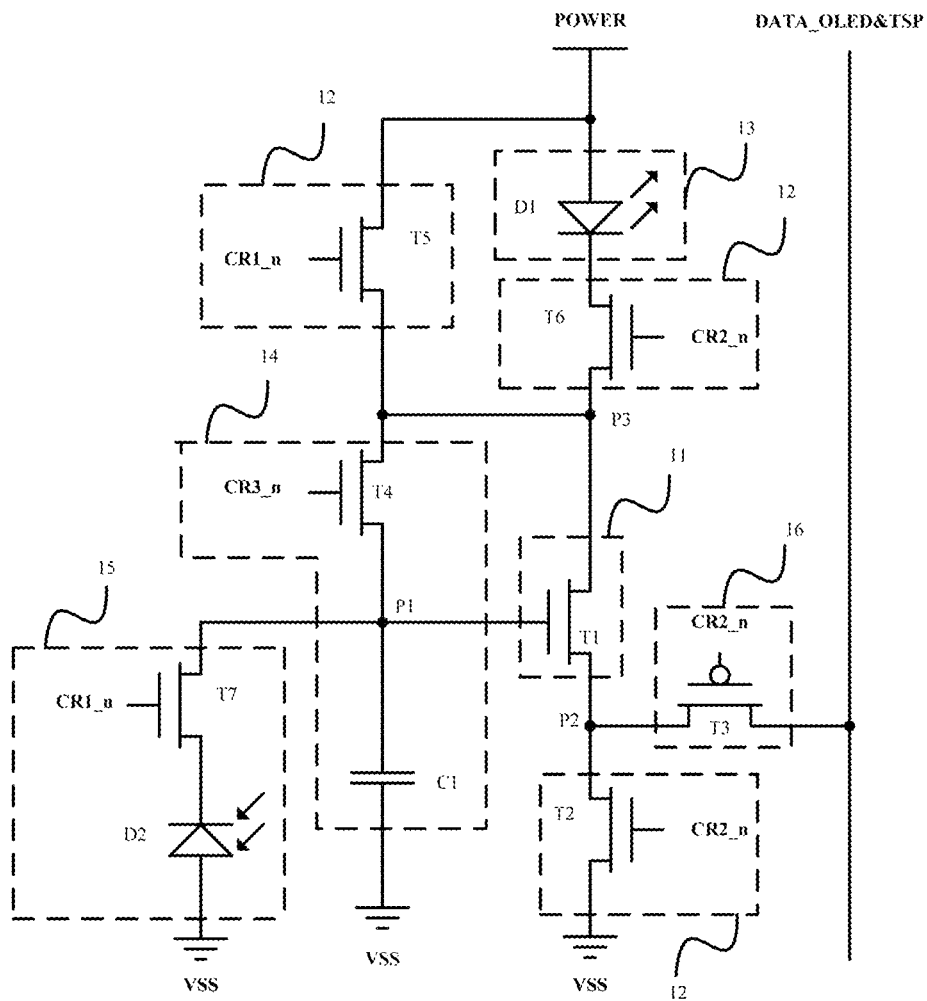
FIG. 3 is a schematic diagram showing an AMOLED pixel unit circuit according to an embodiment of the present invention.

With reference to FIG. 3, the AMOLED pixel unit circuit provided by an embodiment of the present invention comprises: a light emitting module 13, a driving module 11, a threshold compensation module 14, a light emitting control module 12, a touch sensing module 15 and a sensing signal outputting module 16, wherein the driving module 11 is configured to amplify a sensing signal generated by the touch sensing module 15, output the sensing signal through the sensing signal outputting module 16, and drive the light emitting module 13;

the light emitting control module 12 is configured to control the light emitting module 13 to emit light;

the threshold compensation module 14 is configured to compensate a threshold voltage of the driving module 11;

the touch sensing module 15 is configured to generate the sensing signal and output the sensing signal to the driving module 11; and the sensing signal outputting module 16 is configured to output the sensing signal amplified by the driving module 11.

Preferably, the driving module 11 comprises a first transistor T1, the gate electrode thereof is connected to a first node P1 of the circuit, and the other two electrodes are connected to a second node P2 and a third node P3 of the circuit respectively.

Preferably, the light emitting control module 12 comprises a second transistor T2, a fifth transistor T5 and a sixth transistor T6. The gate electrode of the second transistor T2 is connected to a second signal control line of the AMOLED pixel unit circuit in the same stage (corresponding to the second signal CR2_$n$ of the AMOLED pixel unit circuit in the same stage), and the two other electrodes are connected to a low voltage level signal line (corresponding to the low voltage level signal VSS) and the second node P2 of the circuit respectively; the gate electrode of the fifth transistor T5 is connected to a first signal control line of the AMOLED pixel unit circuit in the same stage (corresponding to the first signal CR1_$n$ of the AMOLED pixel unit circuit in the same stage), and the other two electrodes are connected to the third node P3 of the circuit and the power line (corresponding to POWER) respectively; and the gate electrode of the sixth transistor T6 is connected to the second signal control line of the AMOLED pixel unit circuit in the same stage (corresponding to the second signal CR2_$n$ of the AMOLED pixel unit circuit in the same stage), and the other two electrodes are connected to the third node P3 of the circuit and light emitting module 13 respectively.

Preferably, the light emitting module 13 comprises a light emitting diode D1 one end thereof is connected to the sixth transistor T6 and the other end is connected to the power line (corresponding to POWER).

Preferably, the threshold compensation module 14 comprises a fourth transistor T4 and a first capacitor C1;

Wherein, the gate electrode of the fourth transistor T4 is connected to a third signal control line of the AMOLED pixel unit circuit in the same stage (corresponding to the third signal CR3_$n$ of the AMOLED pixel unit circuit in the same stage), and the other two electrodes are connected to the third node P3 and the first node P1 respectively; and the first capacitor C1 is connected between the first node P1 and the low voltage level signal line (corresponding to the low voltage level signal VSS).

Preferably, the touch sensing module 15 comprises a seventh transistor T7 and a photodiode D2. Wherein the gate electrode of the seventh transistor T7 is connected to the first signal control line of the AMOLED pixel unit circuit in the same stage (corresponding to the first signal CR1_$n$ of the AMOLED pixel unit circuit in the same stage), and the other two electrodes are connected to the photodiode D2 and the first node P1 respectively; and one end of the photodiode D2 is connected to the seventh transistor T7 and the other end is connected to the low voltage level signal line (corresponding to the low voltage level signal VSS); or With reference to FIG. 4, the touch sensing module 15 comprises the seventh transistor T7 and an induction capacitor C2. The gate of the seventh transistor T7 is connected to the first signal control line of the AMOLED pixel unit circuit in the same stage (corresponding to the first signal CR1_$n$ of the AMOLED pixel unit circuit in the same stage), and the other two electrodes are connected to a induction capacitor C2 and the first node P1 respectively. One end of the induction capacitor C2 is connected to the seventh transistor T7 and the other end needs to contract with outside such as a human body. The voltage of the induction capacitor C1 is changed depending on the coupling of the induction capacitor coupling and the change of the capacitor.

When the seventh transistor T7 is turned ON, the induction element D2 or C2 may generate induced current input the induced current into the first transistor T1, the first transistor T1 amplifies the induced current and the sensing signal outputting module 16 outputs the same to a data line 16 (corresponding to the data signal DATA_OLED&TSP).

The capacitor C1 may be used by the touch sensing module 15 as a storage capacitor, and the power line is used to alternatively input operating level required by the TSP in Cell circuit and the AMOLED circuit.

Figure 4:
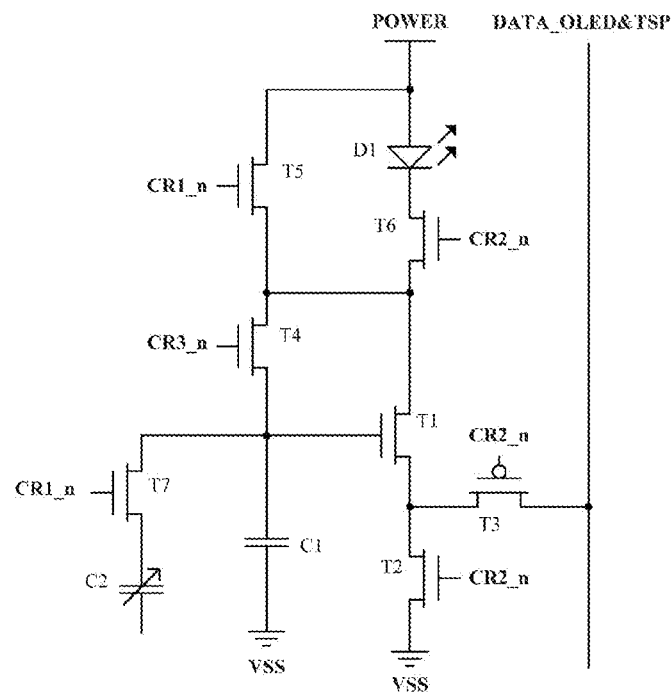
FIG. 4 is a schematic diagram showing an AMOLED pixel unit circuit according to another embodiment of the present invention.

There are two embodiments of the induction element in the present invention, one embodiment is that, as shown in FIG. 3, the induction element is a photodiode; and the other embodiment is that, as shown in FIG. 4, the induction element is an induction capacitor.

Preferably, the sensing signal outputting module 16 comprises a third transistor T3. The gate electrode of the third transistor T3 is connected to the second signal control line of the AMOLED pixel unit circuit in the same stage (corresponding to the second signal CR2_$n$ of the AMOLED pixel unit circuit in the same stage), and the other two electrodes are connected to the data line (corresponding to the data signal DATA_OLED&TSP) and the second node P2 respectively.

Preferably, the anode of the photodiode D2 is connected to the low voltage level signal line (corresponding to the low voltage level signal VSS), and the cathode of the photodiode D2 is connected to the seventh transistor T7.

Preferably, the cathode of the light emitting diode D1 is connected to the sixth transistor T6, and the anode of the light emitting diode D1 is connected to the power line.

Preferably, the first transistor T1, the second transistor T2, the forth transistor T4, the fifth transistor T5, and the sixth transistor T6 are N-type TFTs, and the third transistor T3 is a P-type TFT.

According to an embodiment of the present invention, the value of the third control signal VSS is maintained as a constant, and may be the cut-off level of the N-type TFT specifically.

Next, the working principle of the circuit provided by an embodiment of the present invention will be described with reference to FIG. 3, FIG. 5 and FIG. 6.

Figure 5:
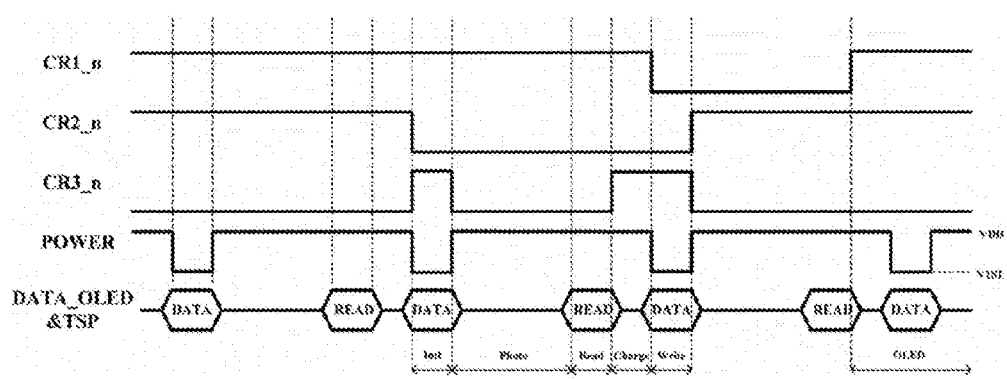
FIG. 5 is a time sequence diagram of a control signal of the AMOLED pixel unit circuit according to an embodiment of the present invention.
Figure 6:
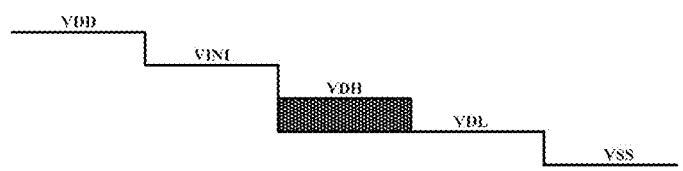
FIG. 6 is a diagram illustrating the level size relationship among the control signals of the AMOLED pixel unit circuit according to an embodiment of the present invention.

FIG. 5 shows time sequences of the control signals of the circuit provided by an embodiment of the present invention. The working procedure of the circuit includes six phases, which are Init Phase, Photo Phase, Read Phase, Charge Phase, Write Phase, and OLED Phase. The VDATA in FIG. 5, which has a value in the range of [VDL, VDH], is the grayscale voltage of the data line DATA_OLED&TSP, and the brightness of D1 is different under different grayscale voltages. The size relationship among the level values of the signals shown in FIG. 5 is VSS<VDL<VDH<VINI<VDD, as shown as in FIG. 6. The level values are preset, and specific values may be set according to actual needs. Each phase will be described in detail as follows.

Init Phase: T5 is ON so that light emitting diode D1 is OFF, and T7 is so that the photodiode D2 functioned as a TPS sensor is connected to the gate electrode of the amplifying transistor T1. C1 functions as a storage capacitor of the TSP amplifying TFT T1. T4 is ON, the level of POWER is VINI, and the TSP in Cell circuit is initialized, that is to say, the storage capacitor of the gate electrode of the amplifying transistor T1 is precharged to the initialized level VINI in order to ensure that T1 works in a saturated and amplified state during the subsequent phases.

Photo Phase: T4 is OFF; the photodiode D2 detects the touch state of a panel. When the panel is touched by a finger, the external light source cannot illuminate the photodiode D2, D2 receives less light and its light induced leakage current is small, and the change of the voltage level of C1 caused by electric leakage is smaller during the Photo Phase. When the panel is not touched by a finger, the external light source may illuminate the photodiode D2, D2 receives light and generates a larger light induced leakage current, and the change of the voltage level of C1 caused by electric leakage is larger during the Photo Phase. Therefore, if the panel is touched, the difference between the voltage of the gate electrode of T1 and the initial voltage is small, and if the panel is not touched, the difference between the voltage of the gate electrode of T1 and the initial voltage is large.

After Photo phase begins, the pixels in the previous line are driven by CR2_$n$–1 and still in Write Phase, and DATA_OLED&TSP inputs DATA voltage level into T1 of the pixels in the previous line. Since a plurality of lines of pixels share DATA_OLED&TSP, during Photo Phase, the voltage level of CR2_$n$ jumps to a low voltage level after the Write Phase of the pixels in previous line is ended.

Read Phase: Results of Photo Phase are stored in C1. At this time, T3 is ON, and DATA_OLED&TSP functions as a readout line for the output voltage of the TSP in Cell, then the amplified transistor T1 amplifies the voltage of the gate electrode of T1 and output the same to the readout line so as to output it to a peripheral TSP readout circuit.

The TSP in Cell circuit works in above three phases, the touch from outside may be sensed and the sensing signal is outputted. Then, the circuit goes into the working phases of AMOLED.

Charge Phase: T4 and T5 are ON, the storage capacitor is charged, the voltage level of the gate electrode of T1 is VINI, and T1 may be regarded as a diode and goes into a saturation state.

Write Phase: T2, T5, and T6 are OFF, T3 and T4 are ON. At this time, DATA_OLED&TSP is used as a data signal input of AMOLED and DATA_OLED&TSP inputs VDATA voltage, the voltage level of node P2 (that is the voltage level of the source electrode of T1) is VDATA, and the initial gate-source voltage VGS of T1 is VINI-VDATA. C1 begins to discharge through T1, T3, and T4 so that the voltage level of the gate electrode of T1 reduces gradually until the gate-source voltage VGS of T1 reaches a threshold voltage VTH. At this time, T1 goes into sub-threshold conducting, and T1 is OFF, and C1 stops discharging through T1. Since C1 has the function of voltage holding and the other end of C1 is connected to VSS, the voltage level of the gate electrode of T1 is VTH+VDATA at this time.

OLED Phase: T3 and T4 are OFF, and T2, T5 and T6 are ON, and OLED begins to emit light. T2 is ON so that the source electrode of T1 is connected to VSS, that is to say, the gate-source voltage of the driving transistor T1 is VGS=VDATA+VTH−VSS.

At this time, the current flowing through the OLED is:

$$I_{T1} = \frac{k}{2} \cdot [VTH + VDATA - VTH - VSS]^2 = \frac{k}{2} \cdot (VDATA - VSS)^2$$

Wherein, k is a constant, and the range of VDATA is VDL to VDH.

An embodiment of the present invention further provides a display panel including the AMOLED pixel unit circuit.

The present invention further provides an electronic product including the display panel.

In conclusion, by redesigning the time sequences and voltage level values of the working signals, and adding a few circuit elements into the existing AMOLED pixel unit circuit, embodiments of the present invention achieve integrating the TSP in Cell circuit into the AMOLED pixel unit circuit by sharing data lines, circuit elements, control signals and or the like.

The above are merely the preferred embodiments of the present invention. It should be noted that, a person skilled in the art may make further improvements and modifications without departing from the principle of the present invention, and these improvements and modifications shall also be considered as the scope of the present invention.

What is claimed is:

1. An Active Matrix Organic Light Emitting Diode (AMOLED) pixel unit circuit, comprising a light emitting circuit, an amplifying and driving circuit, a threshold compensation circuit, a light emitting control-circuit, a touch sensing circuit and a sensing signal outputting circuit, wherein
the amplifying and driving circuit is configured to amplify a sensing signal generated by the touch sensing circuit, output the sensing signal through the sensing signal outputting circuit, and drive the light emitting circuit;
the light emitting control-circuit is configured to control the light emitting circuit to emit light;
the threshold compensation circuit is configured to compensate a threshold voltage of the amplifying and driving circuit;
the touch sensing circuit is configured to generate the sensing signal and output the sensing signal to the amplifying and driving circuit; and
the sensing signal outputting circuit is configured to output the sensing signal amplified by the amplifying and driving circuit,
wherein the amplifying and driving circuit comprises a first transistor, wherein a gate electrode of the first transistor is directly connected to a first node of the AMOLED pixel unit circuit, and a source electrode and a drain electrode of the first transistor are directly connected to a second node and a third node of the AMOLED pixel unit circuit, respectively, wherein the first node is a point directly connecting the amplifying and driving circuit and the threshold compensation circuit; the second node is a point directly connecting the amplifying and driving circuit, the light emitting control circuit, and the sensing signal outputting circuit; and the third node is a point directly connecting the amplifying and driving circuit, the light emitting control circuit, and the threshold compensation circuit.

2. The AMOLED pixel unit circuit according to claim 1, wherein the light emitting control circuit comprises a second transistor, a fourth transistor, a fifth transistor and a sixth transistor, wherein a gate electrode of the second transistor is connected to a second signal control line of the AMOLED pixel unit circuit, and a source electrode and a drain electrode of the second transistor are connected to a low voltage level signal line and the second node of the AMOLED pixel unit circuit, respectively; a gate electrode of the fifth transistor is connected to a first signal control line of the AMOLED pixel unit circuit—a source electrode and a drain electrode of the fifth transistor are connected to the third node of the AMOLED pixel unit circuit and a power line, respectively; and a gate electrode of the sixth transistor is connected to the second signal control line of the AMOLED pixel unit circuit, and a source electrode and a drain electrode of the sixth transistor are connected to the third node of the AMOLED pixel unit circuit and light emitting circuit, respectively.

3. The AMOLED pixel unit according to claim 2, wherein the light emitting circuit comprises a light emitting diode, one end of the light emitting diode is connected to the sixth transistor and the other end of the light emitting diode is connected to the power line.

4. The AMOLED pixel unit circuit according to claim 3, wherein the threshold compensation circuit comprises the fourth transistor and a first capacitor, wherein
  a gate electrode of the fourth transistor is connected to a third signal control line of the AMOLED pixel unit circuit—a source electrode and a drain electrode of the fourth transistor are connected to the third node and the first node, respectively; and the first capacitor is connected between the first node and the low voltage level signal line.

5. The AMOLED pixel unit circuit according to claim 4, wherein the touch sensing circuit comprises a seventh transistor and an induction element, wherein a gate electrode of the seventh transistor is connected to the first signal control line of the AMOLED pixel unit circuit, and a source electrode and a drain electrode of the seventh transistor are connected to the induction element and the first node respectively.

6. The AMOLED pixel unit circuit according to claim 5, wherein the sensing signal outputting circuit comprises a third transistor, a gate electrode of the third transistor is connected to the second signal control line of the AMOLED pixel unit circuit, and a source electrode and a drain electrode of the third transistor are connected to a data line and the second node, respectively.

7. The AMOLED pixel unit circuit according to claim 6, wherein a range of a grayscale voltage of the data line is VDL~VDH, wherein VDL<VDH<a predetermined level, wherein VDL is a low voltage and VDH is a high voltage, where VDL is not equal to VDH.

8. The AMOLED pixel unit circuit according to claim 7, wherein a voltage of the low voltage level signal line is VSS, wherein VSS<VDL.

9. The AMOLED pixel unit circuit according to claim 5, wherein the induction element is a photodiode, an anode of the photodiode is connected to the low voltage level signal line, and a cathode of the photodiode is connected to the seventh transistor.

10. The AMOLED pixel unit circuit according to claim 5, wherein the induction element is an induction capacitor, one end of the induction capacitor is connected to the seventh transistor and the other end is used to detect a touching signal.

11. The AMOLED pixel unit circuit according to claim 3, wherein a cathode of the light emitting diode is connected to the sixth transistor and an anode of the light emitting diode is connected to the power line.

12. The AMOLED pixel unit circuit according to claim 2, wherein the first transistor, the second transistor, the fourth transistor, the fifth transistor, and the sixth transistor are N-type Thin Film Transistors (TFTs), and the third transistor is P-type TFT.

13. A display panel comprising the AMOLED pixel unit circuit according to claim 1.

14. An electronic product comprising the display panel according to claim 13.

* * * * *